United States Patent [19]

Kam

[11] 4,019,160
[45] Apr. 19, 1977

[54] SIGNAL ATTENUATOR CIRCUIT FOR TV TUNER

[75] Inventor: George H. Kam, Tonawanda, N.Y.

[73] Assignee: GTE Sylvania Incorporated, Stamford, Conn.

[22] Filed: Dec. 5, 1975

[21] Appl. No.: 638,144

[52] U.S. Cl. .............................. 333/81 R; 325/319; 325/387; 330/29; 330/145

[51] Int. Cl.² ................. H03H 7/24; H03G 3/00; H04N 5/52

[58] Field of Search ........... 333/17, 81 R; 307/264; 330/29, 145; 323/74, 79, 80; 325/319, 381, 387, 408, 414

[56] References Cited

UNITED STATES PATENTS

| | | | |
|---|---|---|---|
| 3,428,910 | 2/1969 | Webb | 330/145 X |
| 3,624,561 | 11/1971 | Tongue | 333/81 R X |
| 3,800,229 | 3/1974 | Backwinkel et al. | 333/81 R X |
| 3,813,602 | 5/1974 | Van Dijum et al. | 333/81 R |

Primary Examiner—Paul L. Gensler
Attorney, Agent, or Firm—Norman J. O'Malley; Thomas H. Buffton; Robert T. Orner

[57] ABSTRACT

In a tuner for a television receiver, an attenuator circuit coupling a signal input to a signal output network includes a series connected controllable impedance and amplifier stage connected to a source of AGC potential whereby increased signal strength causes an increased AGC potential which reduces current flow through and increases the impedance of the controllable impedance while reducing the gain, and consequently the noise, of the amplifier stage coupled to the signal output network.

In another aspect of the invention, a second attenuator circuit includes a second controllable impedance series coupling a signal input to the attenuator circuit and a third controllable impedance coupling the junction of the first and second controllable impedances to circuit ground for effecting an additional increased attenuation of a received signal.

7 Claims, 2 Drawing Figures 4,019,160

SIGNAL ATTENUATOR CIRCUIT FOR TV TUNER

BACKGROUND OF THE INVENTION

Present day television receivers frequently encounter the problem of properly handling signals of a relatively large magnitude to provide relatively distortion-free and cross-modulation free signals. Thus, TV tuner apparatus must include some provision for dealing with relatively large received signals.

One known form of apparatus for handling relatively large TV signals is set forth in U.S. Pat. No. 3,813,602 issued May 28, 1974. The circuitry includes an attenuator circuit employing a first PIN diode shunting the signal source to a to a potential reference level and a second PIN diode AC coupled in series with an amplifier stage. As the magnitude of a received signal increases, an AGC potential is applied to the second PIN diode so that current flow therethrough decreases and the impedance value increases. Moreover, a decrease in current flow through the second PIN diode is accompanied by an increase in current flow through the first or shunting PIN diode. Thus, the attenuator circuit serves to provide a desirable level of output signal despite application of a signal having an undesired large magnitude.

Although the above-described apparatus does provide advantages and enhanced results over prior known apparatus, it has been found that there are a number of features which leave something to be desired. For example, AC coupling of the amplifier stage to the second PIN diode inhibits any alteration in bias, and consequently gain, of the amplifier stage as current flow through the PIN diode is decreased due to the AGC action. Thus, only a linear change in signal due to the linear impedance characteristics of the PIN diode are experienced whereupon a limited linear attenuation in the signal to noise ratio with respect to gain is achieved.

OBJECTS AND SUMMARY OF THE INVENTION

An object of the present invention is to provide an enhanced tuner for a television receiver. Another object of the invention is to provide a television receiver tuner having improved signal handling capabilities. Still another object of the invention is to provide a television tuner apparatus with improved signal handling and signal to noise ratio capabilities. A further object of the invention is to provide television tuner apparatus having a DC coupled amplifier and controllable impedance means responsive to an automatic gain control (AGC) signal in a television receiver.

These and other and further objects, advantages and capabilities are achieved in one aspect of the invention by a signal attenuator circuit for a TV tuner wherein signal input and output circuits are coupled by a series connected controllable impedance and amplifier stage with the controllable impedance AC coupled to the signal input and DC coupled to a potential reference level and to a control signal for altering the impedance level of the controllable impedance and the gain of the amplifier stage in accordance with alterations in the received signal.

PREFERRED EMBODIMENT OF THE INVENTION

For a better understanding of the present invention, together with other and further objects, advantages and capabilities thereof, reference is made to the following disclosure and appended claims in connection with the accompanying drawings.

Figure 1:
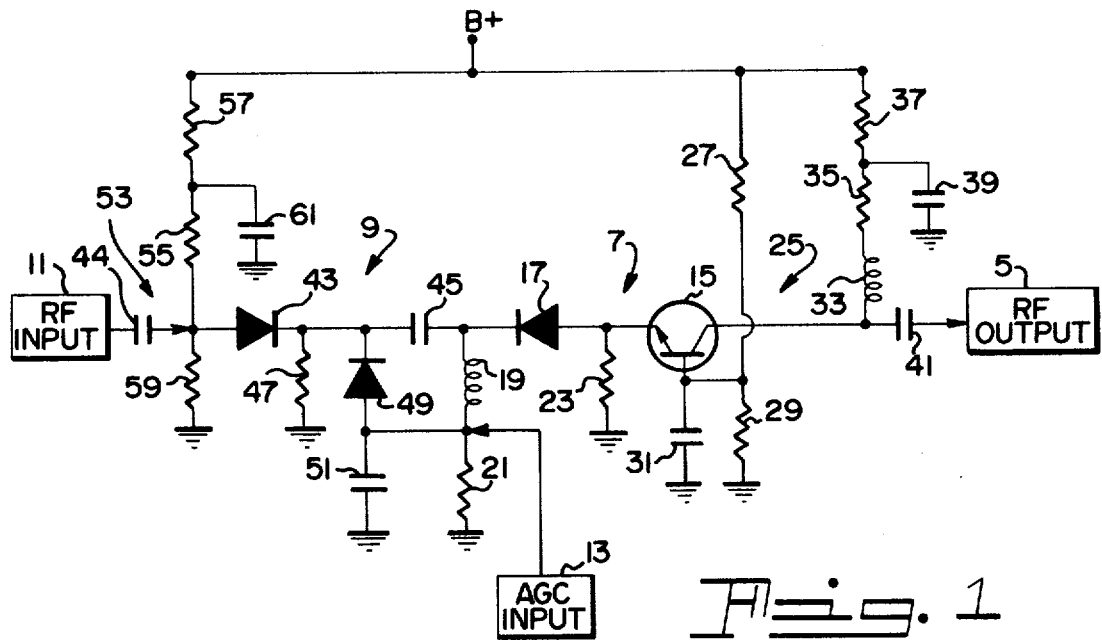
FIG. 1 is a block and schematic illustration of a preferred embodiment of the invention.

Referring to FIG. 1 of the drawings, a radio frequency (RF) tuner for a television receiver includes an RF output network 5 for providing RF signals to a signal receiver. This RF output signal network 5 is coupled to a first attenuator circuit 7 which may be AC coupled to a second attenuator circuit 9 for receiving an RF signal from an RF input circuit 11 connected to an antenna. Moreover, an automatic gain control (AGC) input 13 derived from the signal receiver and varying in accordance with the signal applied to the RF input circuit 11 is directly coupled to the first and second attenuator circuits, 7 and 9 respectively.

More specifically, the first attenuator circuit 7 includes a signal amplifier stage, illustrated as a transistor 15, DC connected to a controllable impedance, illustrated as a PIN diode 17, coupled by a series connected choke 19 to the AGC input signal source 13 and by a resistor 21 to circuit ground. The junction of the DC connected transistor 15 and PIN diode 17 is connected to circuit ground by a current limiting resistor 23.

The base of the transistor 15 is coupled to a bias network 25 having a pair of resistors 27 and 29 series coupling a potential source B+ to ground potential with a capacitor 31 by-passing the base of the transistor 15 to ground potential. The collector of the transistor 15 is coupled by a series connected choke 33, first resistor 35, and second resistor 37 to the potential source B+ with a by-pass capacitor 39 coupling the junction of the first and second resistors 35 and 37 to circuit ground. A capacitor 41 AC couples a signal from the collector of the transistor 15 to the RF output network 5.

The second attenuator circuit 9 includes a second controllable impedance, in the form of a PIN diode 43, AC coupled by a capacitor 44 to the RF input network 11 and AC coupled by a capacitor 45 to the PIN diode 17 of the first attenuator circuit 7. The junction of the PIN diode 43 and capacitor 45 is coupled to circuit ground by a current limiting resistor 47 and by a third controllable impedance, in the form of a PIN diode 49 to the AGC input signal source 13 with a by-passing capacitor 51 coupling the PIN diode 49 to circuit ground. A second bias network 53 includes resistor 55 and resistor 57, series connecting the PIN diode 43 to the potential source B+ and resistor 59 connecting the PIN diode 43 to circuit ground. A by-pass capacitor 61 couples the junction of the resistors 55 and 57 to circuit ground.

As to operation, it is known that a PIN diode mainly behaves as a linear resistor at RF frequency whose value is inversely related to the DC bias current through the PIN diode. Also, it is known that the noise power associated with an RF stage is dependent upon the gain of the RF stage. In other words, reducing the RF stage gain reduces the noise power level from the RF stage.

More specifically, ordinary RF signals available at the RF input network 11 are applied via the second PIN diode 43, first PIN diode 17, and amplifier stage 15 to the RF output network 5. As long as there is no appreciable AGC signals provided in the PIN diode 17 appears as a relatively small impedance value and DC emitter current flows through the transistor 15, PIN diode 17, choke 19, and resistor 21 to circuit ground.

Assuming an increase in the magnitude of the RF signal appearing at the RF input network 11, there will be an accompanying increase in the AGC potential appearing at the AGC input 13. The AGC input 13 will furnish current to the resistor 21 whereupon current flow thereto from the decoupling choke 19, PIN diode 17, and transistor 15 will be reduced.

As current flow through the PIN diode 17 is reduced, the impedance thereof will increase to cause a reduction in current flow through the amplifier stage, transistor 15, and the PIN diode 17. Thus, the increasing impedance of the PIN diode 17 and the reduced current flow through the transistor 15 combine to reduce the gain of the amplifier stage, transistor 15. Moreover, the current limiting resistor 23 serves to insure a minimum level of current flow through the transistor 15 whenever the impedance of the PIN diode 17 increases to a value sufficient to inhibit current flow therethrough.

As a result, this reduction in gain of the amplifier stage, transistor 15, is accompanied by a decrease in noise available at the RF output network 5. In other words, the combined action of an increase in impedance of the PIN diode 17 as well as a reduction in gain of the transistor 15 due to reduced current flow therethrough provides an RF signal output having an enhanced signal to noise ratio as compared with systems wherein the amplifier gain is not reduced.

Figure 2:
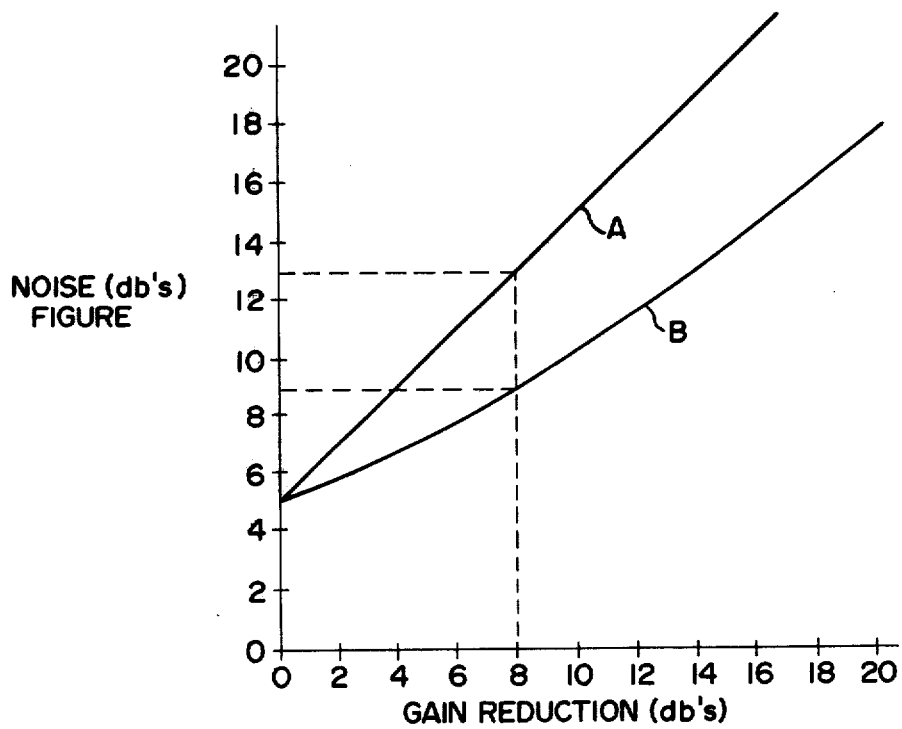
FIG. 2 is a chart graphically comparing the noise figure and gain reduction of the invention of FIG. 1 with a linear responsive control.

Referring to FIG. 2 of the drawings, a comparison chart illustrating noise in DB as compared with gain reduction in DB for a typical TV channel, channel 13 in this example, is provided. Curve A is a linear curve provided by circuitry utilizing only a linear type device, such as a PIN diode, for effecting signal gain reduction. Curve B illustrates signal gain reduction effected by utilization of a linear gain reducing component, such as a PIN diode, in conjunction with gain reduction of an amplifier stage such as provided by the embodiment of FIG. 1.

As can readily be observed from Curves A and B of FIG. 2 comparison graph, a gain reduction for a linear system represented by Curve A results in an equal change increase in noise figure. For example, for an 8 DB reduction in gain the noise figure increases from about 5 DB to 13 DB or an 8 DB increase. However, Curve B illustrating a non-linear system such as the present embodiment provides a noise figure shift from about 5 DB to about 9 DB or an increase in noise figure level of only about 4 DB for an equal 8 DB gain reduction. Thus, the differential between the Curves A and B indicates the improvement in signal to noise ratio of the Curve B, provided by the embodiment of FIG. 1, over an attenuator circuit wherein gain reduction is provided by only a linear device.

Although the above-described first attenuator circuit has been found especially suitable where gain reduction in the range of about 30 to 35 DB is adequate, there are occassions and apparatus wherein a greater reduction in gain is either required or at least desired. Thus, the second attenuator circuit 9 may be added between the RF input 11 and the first attenuator circuit 7.

At received signal levels wherein an AGC potential is not developed, the second controllable impedance 43 is biased by the second bias network 53 such that the PIN diode 43 is highly conductive, acting as a low value of resistance, while the third controllable impedance 49 appears as a high value of resistance and highly non-conductive. Thus, a received RF signal passes through the second attenuator circuit 9 with minimal attenuation.

However, an increased magnitude of received RF signal is accompanied by an accompanying signal increase at the AGC input 13. As the potential at the AGC input 13 increases, the third controllable impedance, PIN diode 49, increases in conductivity and decreases in resistivity value. Moreover, the potential drop thereacross decreases whereupon conductivity of the second controllable impedance, PIN diode 43 of the second attenuator circuit 9 is reduced. As a result, an additional 30 to 35 DB of attenuation is attainable if desired.

Thus, there has been provided a unique signal attenuator circuit for a tuner of a television receiver. The attenuator circuit utilizes not only the linear impedance characteristic of a controllable impedance but also alterations in gain of an amplifier to enhance the noise characteristics of the attenuator circuitry. Moreover, a second attenuator circuit is provided to increase the attenuation capabilities of the tuner if desired.

While there has been shown and described what is at present considered the preferred embodiment of the invention, it will be obvious to those skilled in the art that various changes and modifications may be made therein without departing from the invention as defined by the appended claims.

What is claimed is:

1. TV tuner attenuator circuit comprising:
   signal input and output network means;
   signal amplifier stage coupled to a bias network and to said signal output network means;
   controllable impedance means in the form of a PIN diode AC coupled to said signal input network means and DC coupled to said signal amplifier stage and to a potential reference level; and
   control signal means DC coupled to said controllable impedance means for altering current flow through said signal amplifier stage and controllable impedance means in a direction opposite to the direction of change of said applied signal whereby gain reduction of said signal amplifier stage and increased impedance of said controllable impedance means are combined to non-linearly attenuate an increase in applied signals.

2. The TV tuner attenuator circuit of claim 1 wherein said controllable impedance means includes said PIN diode, a decoupling choke, and a register series coupling said signal amplifier stage to a potential reference level with the junction of said series connected decoupling choke and resistor DC coupled to said control signal means whereby current flow through said PIN diode, decoupling choke, and resistor is varied in accordance with variations in said control signal means.

3. The TV tuner signal attenuator circuit of claim 1 wherein said signal input network means includes a second controllable impedance means in the form of a PIN diode AC coupled to said controllable impedance means and DC coupled to a third controllable impedance means connected to circuit ground and to said control signal means.

4. The TV tuner signal attenuator circuit of claim 3 including a bias development means coupled to said second controllable impedance means.

5. Signal attenuator circuitry for a television receiver tuner comprising:
 a signal amplifier stage including a bias network;
 a signal output network means coupled to said signal amplifier stage;
 a controllable impedance means including a series connected PIN diode and resistor DC coupling said signal amplifier stage to a potential reference level;
 a signal input network means AC coupled to said controllable impedance means; and
 a control signal means DC coupled to said controllable impedance means for varying the impedance value of said controllable impedance means and the gain of said signal amplifier stage in accordance with an applied signal from said signal input network means, said control signal means being responsive to an increase in said applied signal to cause a reduction in gain of said signal amplifier stage and an increase in impedance value of said controllable impedance means to provide a non-linear and an enhanced signal to noise ratio at said signal output network.

6. The signal attenuator circuitry of claim 5 wherein said signal input network means includes a second signal attenuator circuit having a second controllable impedance means AC coupled to said controllable impedance means and DC coupled by a third controllable impedance means to a potential reference level and to said control signal means.

7. The signal attenuator circuitry of claim 6 wherein said second and third controllable impedance means are in the form of PIN diodes.

* * * * *